United States Patent [19]

Mathews

[11] Patent Number: 5,546,331

[45] Date of Patent: Aug. 13, 1996

[54] AC LINE VOLTAGE MEASUREMENT AND CONTROL

[75] Inventor: Mark R. Mathews, Wheaton, Ill.

[73] Assignee: Robertshaw Controls Company, Richmond, Va.

[21] Appl. No.: 208,566

[22] Filed: Mar. 10, 1994

[51] Int. Cl.[6] .................................................. G01D 18/00
[52] U.S. Cl. ..................... 364/571.01; 364/483; 323/266
[58] Field of Search ..................................... 364/483, 481, 364/571.01, 571.04, 571.07; 323/254, 263, 266; 361/23, 30; 219/678

[56] References Cited

U.S. PATENT DOCUMENTS

| | | | |
|---|---|---|---|
| 4,376,968 | 3/1983 | Wueschinski et al. | 323/266 X |
| 4,761,539 | 8/1988 | Carmean | 364/571.04 X |
| 4,780,656 | 10/1988 | Mitchell | 361/30 X |
| 4,908,760 | 3/1990 | Sinn | 364/571.07 X |
| 4,967,304 | 10/1990 | Dougherty | 364/483 X |
| 5,248,967 | 9/1993 | Daneshfar | 364/483 X |

Primary Examiner—Ellis B. Ramirez
Assistant Examiner—Edward Pipala
Attorney, Agent, or Firm—Robert J. Black

[57] ABSTRACT

A measuring and control circuit for measuring the voltage of an alternating current source and controlling the operations of an associated load. A memory associated with the microprocessor is programmed to provide information representative of voltage levels associated with various modes of operation associated with the load. Tested levels are compared with programmed voltage levels to determine needed load control.

8 Claims, 1 Drawing Sheet

5,546,331

AC LINE VOLTAGE MEASUREMENT AND CONTROL

BACKGROUND OF THE INVENTION

1. Field of the Invention

The present invention relates to measurement of alternating current line voltage and more particularly to a system for measuring variations in line voltage and taking such variations into account to make appropriate changes in the operation of an associated system such as an air conditioner or a microwave oven, etc.

2. Background Art

A search of the background art directed to the subject matter of the present invention conducted in the U.S. Patent and Trademark Office disclosed the following U.S. Letters Patent.

| | | |
|---|---|---|
| 4,289,948 | 4,804,916 | 4,961,047 |
| 4,570,054 | 4,825,028 | 4,972,060 |
| 4,613,739 | 4,928,055 | 5,021,620 |

Based on a thorough review of the above identified patents, we believe that none of the above teach, disclose or claim the novel combination of elements and functions found in the improved system taught by the present invention.

In many systems, notably microwave ovens, air conditioning systems, etc., microprocessors are employed to monitor alternating current line voltage. In microwave ovens, as the line voltage varies, the output power varies and consequently this can affect or change the cooking characteristics. If the line voltage is known, such variations can be taken into account and appropriate changes can be made in cooking time for consistent cooking. In an air conditioner, as line voltage drops, current in the compressor will rise and cause over heating. With proper monitoring of the line voltage, the compressor may be shut off before over heating occurs.

A great many techniques have been developed for monitoring line voltage. Many techniques employed for line voltage measurement utilize a comparator. One of the inputs to the comparator would be a reference point set up by a regulated supply. The reference point would then represent a certain voltage level. The second input would be that of the AC line conditioned to provide a stable comparison voltage. Should this voltage drop below the reference point, the comparator would operate indicating that the reference voltage has been reached. Voltage then would have to rise to a certain level for the comparator to return to its original state. Where great accuracy is needed, the method will not function because the circuitry requires a very accurate reference point. Should great accuracy not be required, the values may be approximated. But errors can occur because of the tolerance of the regulated supply, the accuracy of resistor dividers employed as a reference point and the circuitry to condition the AC voltage. Any such errors will cause the desired numbers to vary frequently from the approximated value. The control then would have to be calibrated to give an accurate reference point. Such calibration of controls is done manually, usually with some type of potentiometer to vary the reference point. Any variations due to the load of the transformer are taken into account by coming up with a fixed offset through testing. The same offset would be used by all controls for a given application. This sort of circuit frequently employs a lot of parts and only allows the monitoring of one or two different points on the line, thus calibration is time consuming and still presents the possibility of inaccuracy.

Other techniques include the utilization of a memory to store a look up table for stored values being equivalent to power supply inputs which are then provided by control of the output. In such an arrangement, where the output changes new value is used to control the input causing performance characteristics to remain stable.

Another technique involves the storing of a particular desired factor in the program's memory with adjustments of output voltage based on a particular desired temperature or operating level to be employed.

Other techniques include the measuring of the width of pulses to determine proper operation. As the input alternating current voltage changes, the width of the pulse changes and accordingly steps are taken to make the appropriate corrections in the output voltage.

Accordingly, it is object of the present invention to provide a new and useful alternating current voltage monitoring technique with an associated appropriate control which overcomes the shortcomings of the prior art.

SUMMARY OF THE INVENTION

The present invention is able to monitor line voltage by calibrating itself without the requirement for manual adjustment to account for all component tolerances. In addition to a microprocessor, it also employs a memory device. The control is calibrated at the microprocessor's known line voltage. The microprocessor can then take all the necessary measurements for each control that would normally be done manually, including transformer loading variations and store them in the memory device. This is done by storing the reference value for its calibrated line voltage and then actuating each load that affects line measurement and storing any differences that occur. By means of an analog to digital converter, varying signals are converted into a form that the microprocessor can then read. A memory device, such as an electrically erasable programmable read-only memory is used. Any variations in measurement or components from control to control can be accounted for and a Great degree of accuracy is obtained. Since the microprocessor does all the work, its self-calibration is much quicker than that of manual calibration, requiring substantially fewer parts.

In the present invention, a microprocessor is used to monitor the line voltage. However, it becomes necessary for that line voltage to be conditioned before application to the microprocessor because its high level would damage the microprocessor. Conditioning is usually done by the inclusion of a rectifier and a step-down transformer and/or voltage divider. As the AC line voltage is applied to the conditioning circuit, the output changes proportionately which is then applied to an analog to digital converter. The output of that converter being applied to the microprocessor. As the microprocessor reads the analog to digital converter, it can see the variations in alternating current line voltage. In many instances, the output of the rectifier or conditioning circuit can also be used to power the microprocessor and its associated circuitry. Consequently, a degree of filtering is required to provide a more steady signal and further reduction by means of a voltage resistor divider, etc. With adequate filtering, the signal does not vary much and sampling by the microprocessor at line frequency may not be required. However, any ripple may still affect the accuracy of the measurement. Because the present circuitry employs transformers, it must be recognized that any circuitry powered by it will reduce the DC output independent of any AC line voltage applied. Clearly, reduction depends on the power utilized by the additional circuitry. Such loading can cause erroneous measurements and must be accounted for by the microprocessor.

Included in the present system is a memory device for the purpose of calibration of the control. Calibration is induced by producing an event that the microprocessor will recognize, i.e., certain key combination on power up, forcing a pin on the microprocessor to a certain level, etc. We recognize that such events do not chance during normal use. During calibration, a microprocessor known AC line voltage is applied to the control. The microprocessor then reads the analog to digital converter output and stores such value in its memory. The microprocessor retrieves from the memory the value that corresponds to the known calibration voltage. That then produces a reference point. Since the amount of data that can be stored in the memory is only limited by the memory size itself, the differences due to loading can also be stored. To determine what the line voltage is after calibration, the microprocessor could retrieve the reference value and offset for the current loaded condition from the memory. At this point, the microprocessor is able to sum the offset and the analog to digital converter value it is currently reading. Then the microprocessor can take the ratio of that sum and the reference value and multiply it by the calibrated line voltage The result would then be produced as the current line voltage. In this manner, the microprocessor could effectively monitor the line voltage accurately.

DETAILED DESCRIPTION OF THE PREFERRED EMBODIMENT

Figure 1:
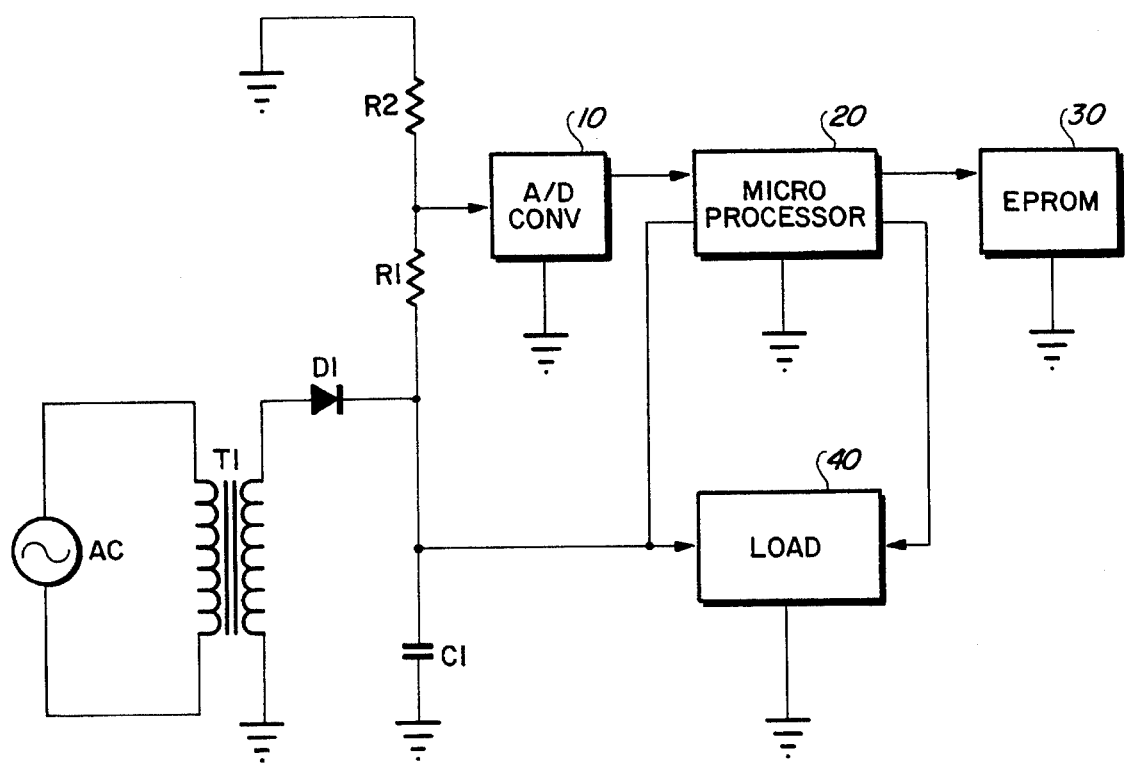
In FIG. 1, a better understanding of the present invention may be had from the consideration of the following detailed description taken in conjunction with the accompanying combination schematic and block diagram drawing of an alternating current voltage monitoring and control system.

Referring now to the accompanying drawing, an alternating current AC is shown connected to a step down transformer T1. The secondary of step down transformer T1 is connected to a half wave rectifier circuit, including diode D1. Full wave rectifiers (not shown) could also be employed at this point, too. The choice of rectifier will make a difference to the microprocessor when making measurements. If the microprocessor 20 attempts to make a measurement on the wrong part of a half wave rectified signal, it will always see a "0". Obviously, it then must make its measurement on the alternate half cycles. As shown in the accompanying drawing, the output of the rectifier is connected to a further conditioning circuit or voltage divider consisting of resistors R1 and R2 to further reduce the output voltage which is taken from the center tap between resistors R1 and R2 and connected to the input of analog to digital converter 10 whose output in turn is connected to microprocessor 20. It should be noted that some commercially available microprocessors also include an analog to digital converter therein (not shown in the drawing) and accordingly the output from the conditioning circuit could then be applied directly to the microprocessor A-D input. Also connected to the microprocessor 20 is a memory 30 which in the present instance may be an electrically programmable read-only memory.

Capacitor C1 connected to the output of the rectifier functions as a filter with a Dc output from the rectifier D1 further reducing any ripple before applying it to the load 40. It is also noted that load 40 receives additional control input from microprocessor 20. This load circuit might conceivably be a relay that controls an air conditioner or a microwave oven or a number of other similar appliances that require microprocessor control to provide effective operation. As the alternating current line voltage from alternating current source AC is applied to transformer T1, output voltage obviously changes proportionately. The DC voltage developed is then applied to the analog to digital converter 10 whose output is connected to microprocessor 20. The microprocessor internal circuitry then reads the analog to digital converter output to determine the line voltage variation of the alternating current. Microprocessor 20 must read the analog to digital converter at the same frequency as the line voltage that is being monitored, i.e., 60 CPS, etc. The output of the rectifier is still a varying signal so the measurement needs to be taken at the same point on the signal at all times. As noted before, if a half wave rectifier is utilized as shown in the accompanying drawing, measurements can only be taken from the rectified half of the wave. In most instances, the output of the rectifier is utilized to power the microprocessor and its associated circuitry. In this case, the output is filtered by means of a capacitor such as C1 to provide a more steady signal. It could also be possible to employ a resistor divider, such as that employed for R1 and R2 to further reduce the signal. If enough filtering is provided, the signal does not vary significantly or have a substantial amount of ripple and sampling frequency by the microprocessor at line frequency may not be needed. However, it must be recognized that ripple may still affect the accuracy of the measurement.

Circuitry, such as load 40, which derives its power through a transformer such as T1, will tend to reduce the DC output independent of any AC line voltage applied to the primary of transformer T1. Clearly, the reduction depends upon the power utilized by the additional circuitry. This loading can frequently cause erroneous measurements and must be accounted for by the microprocessor. Inclusion of memory device 30 into the present design will be apparent because of its function during calibration of the control. Calibration is induced by producing an event that the microprocessor will recognize, i.e., certain key combination on power up, forcing a pin on the microprocessor to a certain level, etc. It should be an event that would not chance during normal operation. This will prevent a user from accidentally calibrating a control and losing factory calibration. During calibration, a microprocessor's known alternating current line voltage is applied to the control. The microprocessor then reads the analog to digital converter output and stores its value into the memory 30. It can later retrieve from the memory the value that corresponds to the known calibration voltage. This then provides a reference point. Since the amount of data that can be retrieved from memory is only limited by the memory size itself, differences due to loading can also be stored. This is done by turning on each load or combination of loads that affect measurements during monitoring and storing the differences between the reference value and the loaded values in memory 30. To determine what line voltage is after calibration, the microprocessor 20 would retrieve the reference value and the offset for the current loaded condition from the memory. At this time then, the microprocessor 20 will sum the offset to the analog to digital converter value 10 that it is presently reading. Microprocessor 20 then takes the ratio of that sum and the reference value and multiplies it by the calibrated line voltage. The result would be the present line voltage.

$$\frac{OFF + SIG}{REF} \times Vcal = Vnow$$

OFF - the difference between present loaded value and calibration value.
SIG - the analog to digital value for the present line voltage.
REF - the calibrated analog to digital value.
Vcal - the line voltage the control was calibrated at.
Vnow - the present line voltage.

By using this method, the microprocessor can monitor the line voltage accurately and provide appropriate control.

While but a single embodiment of the present invention has been shown, it will be obvious to those skilled in the art that numerous modifications may be made without departing from the spirit of the present invention, which shall be limited only by the scope of the claims appended hereto.

What is claimed is:

1. A circuit for measuring variations in voltage from a connected alternating current source and for controlling an associated load connected to said source, in response to said measurement variations, said circuit comprising:

an analog to digital converter;

a conditioning circuit connected between said source of alternating current and said analog to digital converter, said conditioning circuit operated to modify voltage from said alternating current source and connect said modified voltage to said analog to digital converter;

a microprocessor connected to said load operable to control operations of said load, said microprocessor including circuit connections to said analog to digital converter and to an associated memory;

said analog to digital converter operated to connect digital signal representations of said modified voltages to said microprocessor;

said memory programmed by measuring the voltage at a plurality of predetermined different load operations to store therein digital information related to alternating current voltage measurements at said plurality of different load operations;

said microprocessor operated to compare said digital information stored in said memory with said digital signal representation of said modified voltage values received from said analog to digital converter and in response to said comparison, said microprocessor further operated to control said load.

2. A circuit as claimed in claim 1 wherein:

said conditioning circuit includes voltage reduction means operated to reduce the value of voltage from said alternating current source;

and rectifier means operated to change said voltage from said alternating current source from alternating current to direct current.

3. A circuit as claimed in claim 2 wherein:

said voltage reduction means comprise a step down transformer.

4. A circuit as claimed in claim 2 wherein:

said voltage reduction means comprise a resistive voltage divider.

5. A circuit as claimed in claim 2 wherein:

said rectifier means comprise a half-wave rectifier.

6. A circuit as claimed in claim 2 wherein:

said rectifier-means is a full-wave rectifier.

7. A circuit as claimed in claim 1 wherein:

said analog to digital converter is included in said microprocessor.

8. A circuit as claimed in claim 1 wherein:

said memory is of the electrically programmable read-only memory type.

* * * * *